United States Patent
Zhao et al.

(10) Patent No.: US 11,258,231 B2
(45) Date of Patent: Feb. 22, 2022

(54) GAN-BASED VCSEL CHIP BASED ON POROUS DBR AND MANUFACTURING METHOD OF THE SAME

(71) Applicant: Institute of Semiconductors, Chinese Academy of Sciences, Beijing (CN)

(72) Inventors: Lixia Zhao, Beijing (CN); Chao Yang, Beijing (CN); Lei Liu, Beijing (CN); Jing Li, Beijing (CN); Kaiyou Wang, Beijing (CN); Hongda Chen, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 113 days.

(21) Appl. No.: 16/500,035

(22) PCT Filed: Jun. 1, 2017

(86) PCT No.: PCT/CN2017/086855
§ 371 (c)(1),
(2) Date: Oct. 1, 2019

(87) PCT Pub. No.: WO2018/184288
PCT Pub. Date: Oct. 11, 2018

(65) Prior Publication Data
US 2020/0185882 A1 Jun. 11, 2020

(30) Foreign Application Priority Data
Apr. 6, 2017 (CN) .......................... 201710220057.6

(51) Int. Cl.
*H01S 5/183* (2006.01)
*H01S 5/042* (2006.01)
(Continued)

(52) U.S. Cl.
CPC ...... *H01S 5/18361* (2013.01); *H01S 5/04253* (2019.08); *H01S 5/3054* (2013.01); *H01S 5/3086* (2013.01); *H01S 5/34333* (2013.01)

(58) Field of Classification Search
CPC ............ H01S 5/18361; H01S 5/18363; H01S 5/18369; H01S 5/18377; H01S 5/183;
(Continued)

(56) References Cited

U.S. PATENT DOCUMENTS

| | | | |
|---|---|---|---|
| 2008/0230716 A1 | 9/2008 | Tysoe et al. | |
| 2014/0003458 A1* | 1/2014 | Han | H01L 21/306 372/45.01 |

(Continued)

FOREIGN PATENT DOCUMENTS

| | | |
|---|---|---|
| CN | 201523603 | 9/2009 |
| CN | 103325894 | 9/2013 |

(Continued)

OTHER PUBLICATIONS

Cheng Zhang et al. "Distributed bragg reflectors for GaN-based Vertica-Cavity Surface-Emitting Lasers" Appl. Sci. (2019), 9, 1593, pp. 1-20. (Year: 2019).*

(Continued)

*Primary Examiner* — Minsun O Harvey
*Assistant Examiner* — Delma R Fordé
(74) *Attorney, Agent, or Firm* — Fish & Richardson P.C.

(57) ABSTRACT

A GaN-based VCSEL chip based on porous DBR and a manufacturing method of the same, wherein the chip includes: a substrate; a buffer layer formed on the substrate; a bottom porous DBR layer formed on the buffer layer; an n-type doped GaN layer formed on the bottom porous DBR layer, which is etched downward on its periphery to form a mesa; an active layer formed on the n-type doped GaN layer; an electron blocking layer formed on the active layer; a (Continued)

p-type doped GaN layer formed on the electron blocking layer; a current limiting layer formed on the p-type doped GaN layer with a current window formed at a center thereof, wherein the current limiting layer covers sidewalls of the active layer, the electron blocking layer and the convex portion of the n-type doped GaN layer; a transparent electrode formed on the p-type doped GaN layer; an n-electrode formed on the mesa of the n-type doped GaN layer; a p-electrode formed on the transparent electrode with a recess formed therein; and a dielectric DBR layer formed on the transparent electrode in the recess of the p-electrode.

6 Claims, 3 Drawing Sheets

(51) Int. Cl.
*H01S 5/30* (2006.01)
*H01S 5/343* (2006.01)

(58) Field of Classification Search
CPC ............ H01S 5/18344; H01S 5/18347; H01S 5/04253; H01S 5/42–426; H01S 5/18–187
See application file for complete search history.

(56) References Cited

U.S. PATENT DOCUMENTS

| | | | | |
|---|---|---|---|---|
| 2014/0126600 A1* | 5/2014 | Kawashima | ........... | B82Y 20/00 |
| | | | | 372/45.01 |
| 2015/0131691 A1* | 5/2015 | Lee | .................... | H01S 5/18377 |
| | | | | 372/50.11 |
| 2015/0303655 A1* | 10/2015 | Han | .................... | H01S 5/34333 |
| | | | | 372/45.012 |
| 2016/0153113 A1* | 6/2016 | Zhang | ................. | C25B 1/55 |
| | | | | 252/521.5 |
| 2017/0237234 A1* | 8/2017 | Han | ................. | H01L 33/10 |
| | | | | 372/45.012 |
| 2019/0221993 A1* | 7/2019 | Hammond | ............ | H01S 5/0206 |

FOREIGN PATENT DOCUMENTS

| | | | | |
|---|---|---|---|---|
| CN | 105449057 | | 3/2016 | |
| TW | 200929758 | * | 7/2009 | ............. H01S 5/183 |
| WO | 2016054232 A1 | | 4/2016 | |

OTHER PUBLICATIONS

P H Griffin et al. "Porous nitride semiconductors reviewed" J. Phys. D: Appl. Phys. 53 383002, (2020) pp. 1-19. (Year: 2020).*
Rami T. ElAfandy et al. "Room-temperature operation of c-plane GaN vertical cavity surface emitting laser on conductive nanoporous distributed Bragg reflector" Appl. Phys. Lett. 117, (2020), pp. 011101-through 011101-5. (Year: 2020).*
PCT/CN2017/086855 International Search Report/Written Opinion dated Jan. 17, 2018, 3 pgs.
Chinese Application No. 2017022057.6, First Office Action dated Feb. 24, 2018 with English translation, 71 pages.
Chinese Application No. 2017022057.6, Second Office Action dated Oct. 17, 2018 with English translation, 13 pages.
Chinese Application No. 2017022057.6, Third Office Action dated Apr. 24, 2019 with English translation, 8 pages.

* cited by examiner

GAN-BASED VCSEL CHIP BASED ON POROUS DBR AND MANUFACTURING METHOD OF THE SAME

CROSS-REFERENCE TO RELATED APPLICATIONS

This application is a U.S. National Phase Application of International Application No. PCT/CN2017/086855, filed on Jun. 1, 2017, entitled "GAN-BASED VCSEL CHIP BASED ON POROUS DBR AND MANUFACTURING METHOD OF THE SAME," which claims priority to Chinese Application No. 201710220057.6, filed on Apr. 6, 2017, both of which are incorporated herein by reference in their entirety.

TECHNICAL FIELD

The present disclosure belongs to the field of laser light sources, and in particular to a GaN-based VCSEL (vertical cavity surface emitting laser), in particular to a GaN-based VCSEL chip based on porous DBR (Bragg reflector) bottom mirror and a manufacturing method of the same.

BACKGROUND

GaN semiconductor-based lasers have shown great application prospects and market demands in high-density optical storage, laser illumination, laser display, visible light communication, and the like. In recent years, they have attracted much attention in international research and industry. At present, GaN-based edge-emitting lasers have been commercialized, but vertical cavity surface emitting lasers (VCSELs) with better performance have not yet reached the practical level. Compared with the traditional edge-emitting laser, the GaN-based VCSEL has good dynamic single-mode characteristics and spatial emission mode characteristics, low working threshold, small beam divergence angle, low fabrication cost, high temperature stability and so on. It can also realize high density two-dimensional array integration and higher power optical output. Therefore, the application prospect of the GaN-based VCSEL is broader.

However, for the reported GaN-based VCSEL, it is difficult to obtain an optical cavity of high quality factor, and in particular, it is difficult to realize a highly reflective bottom mirror constituting the cavity. Generally, the top mirror may adopt the dielectric DBR with mature technology, such as $SiO_2/TiO_2$-based DBR, however, the bottom mirror needs to grow and embed directly on the substrate side of the epitaxial structure of VCSEL, such as the epitaxially grown AlN/GaN-based nitride DBR layer, and generally, the higher the reflectivity of the bottom mirror, the better. Due to the lattice mismatch and the difference of thermal expansion coefficient of AlN/GaN, it is extremely difficult to manufacture high quality AlN/GaN-based DBR in the actual process. At the same time, due to the small difference of refractive index of AlN/GaN, it is often necessary to increase the number of periods of DBR and introduce a superlattice insertion layer to achieve high reflectivity of the mirror, which will further increase the difficulty of epitaxy of AlN/GaN-based DBR. Therefore, the growth process of nitride DBR represented by AlN/GaN-based DBR is complicated, the epitaxial conditions are extremely severe, and the repetition rate is not high.

Another alternative is to peel off the epitaxial layer from the substrate by laser stripping, then deposit a dielectric DBR layer or metal mirror on the peeled GaN surface, and then thermo-bond with another substrate or plate a copper substrate. The method avoids the problem of epitaxial growth of nitride DBR, and can realize the bottom mirror with high reflectivity, which is beneficial to obtain the resonant microcavity with high quality factor. However, the method of laser stripping is costly, and the bottom of the epitaxial layer after peeling is very uneven, and it needs to be chemically polished to achieve flattening of the peeled surface, thereby reducing scattering loss. In addition, in order to minimize the effect of laser stripping on the active area, it is often necessary to use a longer cavity length to keep the active area away from the peeled surface, but this will reduce the quality factor of the cavity. Therefore, the method of depositing the dielectric DBR bottom mirror by stripping the substrate has a complicated device process and is expensive, and is not ideal for practical GaN-based VCSELs.

SUMMARY

An object of the present disclosure is to provide a GaN-based VCSEL chip based on porous DBR and a manufacturing method of the same, in which the lateral porous DBR is used as the bottom mirror of GaN-based VCSEL, and the high-quality embedding of the VCSEL bottom mirror is realized by directly growing alternately stacked lightly doped layers and heavily doped layers in the VCSEL epitaxial structure and is transformed, by lateral electrochemical etching, into a DBR structure in which the porous layer and the non-porous layer are alternately stacked. On this basis, the dielectric DBR layer is used as the top mirror, and the manufacturing of the device is completed by the conventional VCSEL process.

To achieve the above object, the present disclosure provides a GaN-based VCSEL chip based on porous DBR, comprising:

a substrate made of sapphire, Si or SiC;

a buffer layer formed on an upper surface of the substrate;

a bottom porous DBR layer formed on an upper surface of the buffer layer;

an n-type doped GaN layer formed on an upper surface of the bottom porous DBR layer, wherein the n-type doped GaN layer is etched downward on its periphery to form a mesa having a depth smaller than a thickness of the n-type doped GaN layer, and a middle of the n-type doped GaN layer is a convex portion;

an active layer formed on the convex portion of the n-type doped GaN layer;

an electron blocking layer formed on an upper surface of the active layer;

a p-type doped GaN layer formed on an upper surface of the electron blocking layer;

a current limiting layer made of an insulating medium and formed on an upper surface and side surfaces of the p-type doped GaN layer, a current window being formed at a center of the current limiting layer, wherein the current limiting layer covers sidewalls of the active layer, the electron blocking layer and the convex portion of the n-type doped GaN layer and covers a portion of the mesa;

a transparent electrode formed at the current limiting layer over the p-type doped GaN layer and the current window;

an n-electrode formed on the mesa of the n-type doped GaN layer;

a p-electrode formed on a periphery of the transparent electrode with a recess formed therein; and a dielectric DBR layer formed on an upper surface of the transparent electrode in the recess of the p-electrode.

The present disclosure also provides a method for manufacturing a GaN-based VCSEL chip based on porous DBR, comprising:

step 1: growing a buffer layer, alternately stacked lightly doped layers and heavily doped layers, an n-type doped GaN layer, an active layer, an electron blocking layer, and a p-type doped GaN layer on a substrate sequentially, wherein the substrate is made of sapphire, Si or SiC;

step 2: performing lateral etching on the alternately stacked lightly doped layers and heavily doped layers by using an electrochemical etching method, so as to transform them to a bottom porous DBR layer in which porous layers and non-porous layers are alternately stacked;

step 3: etching down on a periphery of the p-type doped GaN layer by a depth so that a portion of the n-type doped GaN layer is etched, so as to form a mesa on the periphery of the n-type doped GaN layer;

step 4: forming a current limiting layer on sidewalls of the p-type doped GaN layer, the mesa, the active layer, and the electron blocking layer;

step 5: forming a current window on the current limiting layer, and removing a portion of the current limiting layer on the mesa, using a photolithography or etching technique;

step 6: forming a transparent electrode at the current window on the p-type doped GaN layer;

step 7: forming an n-electrode and a p-electrode on the mesa on which a portion of the current limiting layer is removed and a periphery of the transparent electrode respectively, wherein a recess is formed in a middle of the p-electrode; and step 8: forming a dielectric DBR layer on an upper surface of the transparent electrode in the recess of the p-electrode, so as to complete the manufacturing.

The beneficial effects of the present disclosure are as follows. Since the manufacturing of porous DBR only needs epitaxial growth of GaN layer whose doping concentration is periodically modulated and the manufacture is implemented by electrochemical etching, there is no lattice mismatch problem. Moreover, the implementation process of porous DBR is simple and repeatable, and porous DBR can be directly embedded in the bottom of the chip, which is beneficial to practical application. At the same time, when the optical cavity is formed, the highly reflective porous DBR is used as the bottom mirror, and the dielectric DBR with mature technology is used as the top mirror, which is beneficial to obtain GaN-based electrically pumped VCSEL devices with high quality factor, thereby meeting the needs of high power output, high density integrated light source in the fields of optical storage, optical communication, display and the like.

BRIEF DESCRIPTION OF THE DRAWINGS

To make the objectives, technical solutions, and advantages of the present disclosure clearer, the present disclosure will be further described in detail below in conjunction with the specific embodiments and with reference to the accompanying drawings. Here, a green porous DBR and its VCSEL will be described as a preferred embodiment. Wherein.

DETAILED DESCRIPTION

Figure 1:
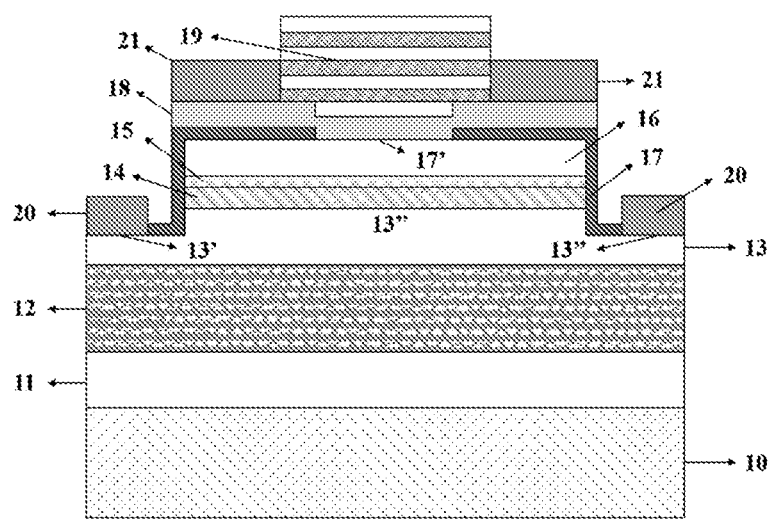
FIG. 1 is a schematic structural view according to an embodiment of the present disclosure.

In the present disclosure, the terms "include" and "comprise" and their derivatives are intended to be inclusive and not limiting.

It should be noted that the directional terms mentioned in the present disclosure, such as "upper", "lower", "front", "back", "left", "right", and the like, are only referring to the directions of the drawings, and not used to limit the scope of protection of the present disclosure. The same elements are denoted by the same or similar reference numerals throughout the drawings. Conventional structures or configurations will be omitted when they may cause confusion to the understanding of the present disclosure. The shapes and sizes of the various components in the drawings do not reflect the true size and proportions, but merely illustrate the contents of the embodiments of the present disclosure.

Referring to FIG. 1, the present disclosure provides a GaN-based VCSEL chip based on porous DBR, including:

A substrate 10, which may be a planar or patterned substrate and may be made of sapphire, Si or SiC;

A buffer layer 11, formed on the upper surface of the substrate 10 and composed of a low-temperature GaN nucleation layer and an unintentionally doped GaN layer. High-purity pure ammonia gas may be used as a nitrogen source, and trimethylgallium or triethylgallium may be used as a Ga source. The GaN nucleation layer is first grown at a low temperature, and then the unintentionally doped GaN layer is grown at a high temperature. The material which may be used as the nucleation layer also includes AlN, ZnO or graphene;

A bottom porous DBR layer 12 formed on the upper surface of the buffer layer 11. The material of the bottom porous DBR layer 12 is GaN, AlGaN, InGaN or AlInGaN, or a combination of the above materials, and the bottom porous DBR layer 12 is a multi-periodic DBR formed by stacking porous layers and non-porous layers alternately;

Wherein, the bottom porous DBR layer 12 is obtained by electrochemical etching of the lightly doped layer and the heavily doped layer which are alternately stacked, wherein the typical doping concentration of the heavily doped layer is $1\times10^{19}$ cm$^{-3}$, the typical doping concentration of the lightly doped layer is $5\times10^{16}$ cm$^{-3}$, and the number of periods of the bottom porous DBR layer 12 may be 12;

An n-type GaN layer is further grown between the bottom porous DBR layer 12 and the buffer layer 11, and is used as a current spreading layer applied for electrochemical etching to form the bottom porous DBR layer 12;

An n-type doped GaN layer 13, with the dopant of silane and the typical doping concentration of $1\times10^{18}$ cm$^{-3}$, formed on an upper surface of the bottom porous DBR layer 12, wherein the n-type doped GaN layer 13 is etched downward on its periphery to form a mesa 13' having a depth smaller than the thickness of the n-type doped GaN layer 13, and the middle of the n-type doped GaN layer 13 is a convex portion 13";

An active layer 14 formed on the convex portion 13" of the n-type doped GaN layer 13. The active layer 14 is an InGaN/GaN multiple quantum well structure, the peak wavelength of which is near 520 nm and corresponds to the high reverse band of the bottom porous DBR layer 12, so as to realize the matching of the light emission wavelength and the resonance wavelength;

An electron blocking layer 15 formed on the upper surface of the active layer 14. The electron blocking layer 15 is made of AlGaN, which may be p-type doped with the dopant of ferrocene;

A p-type doped GaN layer 16 formed on the upper surface of the electron blocking layer 15;

A current limiting layer 17, which may be an insulating medium and formed on the upper surface and side surfaces of the p-type doped GaN layer 16. A current window 17' is formed at the center of the current limiting layer 17 to achieve carrier narrowing, and a typical current window is a circular hole pattern having a diameter of 10-30 μm. The current limiting layer 17 covers the sidewalls of the active layer 14, the electron blocking layer 15, and the convex portion 13" of the n-type doped GaN layer 13, and covers a portion of the mesa 13', so as to achieve sidewall passivation, reducing leakage paths of the device;

The material of the current limiting layer 17 is $SiO_2$, $SiN_x$, $HfO_2$ or $Al_2O_3$;

A transparent electrode 18 formed at the current limiting layer 17 over the p-type doped GaN layer 16 and the current window 17'. The material that may be used as the transparent electrode includes indium-doped tin oxide ITO, graphene, ZnO thin film, transparent metal or nano silver wire, or a composite film material of the above materials;

An n-electrode 20 formed on the mesa 13' of the n-type doped GaN layer 13;

A p-electrode 21 formed on the periphery of the transparent electrode 18 with a recess formed therein;

The metal material used for the n-electrode 20 and the p-electrode 21 is Cr/Al/Ti/Au, Cr/Pt/Au, Ni/Au, Ni/Ag/Pt/Au, Ti/Au or Ti/Pt/Au;

A dielectric DBR layer 19 formed, as a top mirror, on the upper surface of the transparent electrode 18 in the recess of the p-electrode 21. The dielectric DBR layer 19 may have a multi-periodic $SiO_2/TiO_2$, $SiO_2/Ta_2O_5$, $TiO_2/Al_2O_3$ or $ZrO_2/SiO_2$ structure. A phase adjustment layer is also included in the dielectric layer near the transparent electrode 18 to adjust the electric field distribution in the VCSEL and reduce the absorption loss of the transparent electrode 18 as much as possible.

The dielectric DBR layer 19 and the bottom porous DBR layer 12 constitute upper and lower mirrors of the VCSEL chip respectively, and the bottom porous DBR layer 12 has a reflectivity of above 95% at a peak wavelength of the active layer 14, which is higher than the reflectivity of the dielectric DBR layer 19 to allow the VCSEL device to emit light from the side of the top dielectric DBR layer.

Figure 2:
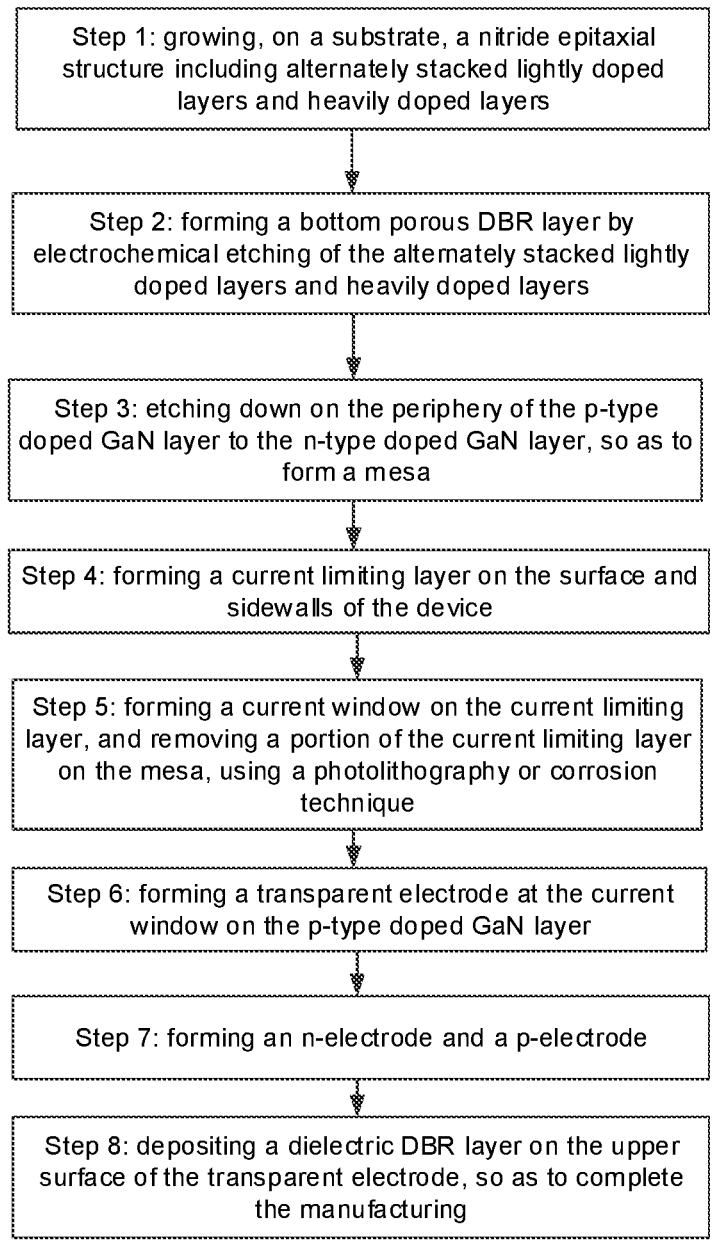
FIG. 2 is a flow chart of the manufacturing according to an embodiment of the present disclosure.

Referring to FIG. 2, and in conjunction with FIG. 1, the present disclosure provides a method for manufacturing a GaN-based VCSEL chip based on porous DBR, comprising the following steps:

Step 1: growing the buffer layer 11, alternately stacked lightly doped layers and heavily doped layers, the n-type doped GaN layer 13, the active layer 14, the electron blocking layer 15, and the p-type doped GaN layer 16 on the substrate 10 sequentially;

The material of the substrate 10 is sapphire, Si or SiC. The material of the bottom porous DBR layer 12 is a multi-periodic DBR formed by stacking porous nitride layers and non-porous nitride layers alternately, and the constituent material is GaN, AlGaN, InGaN or AlInGaN, or a combination of the above materials. An n-type GaN layer is further grown between the bottom porous DBR layer 12 and the buffer layer 11, and is used as a current spreading layer applied for electrochemical etching to form the porous DBR;

Step 2: performing lateral etching on the alternately stacked lightly doped layers and heavily doped layers by using an electrochemical etching method, so as to transform them to a bottom porous DBR layer 12 in which porous layers and non-porous layers are alternately stacked;

Step 3: etching down on the periphery of the p-type doped GaN layer 16 by a depth so that a portion of the n-type doped GaN layer 13 is etched, so as to form a mesa 13' on the periphery of the n-type doped GaN layer 13;

Step 4: forming the current limiting layer 17 on the sidewalls of the p-type doped GaN layer 16, the mesa 13', the active layer 14, and the electron blocking layer 15 to achieve carrier narrowing and sidewall passivation, and to reduce the leakage paths of the device; wherein the material of the current limiting layer 17 is $SiO_2$, $SiN_x$, $HfO_2$ or $Al_2O_3$;

Step 5: forming the current window 17' on the current limiting layer 17, and removing a portion of the current limiting layer 17 on the mesa 13', using a photolithography or etching technique;

Step 6: forming the transparent electrode 18 at the current window 17' on the p-type doped GaN layer 16;

Step 7: forming the n-electrode 20 and the p-electrode 21 on the mesa 13' on which a portion of the current limiting layer 17 is removed and the periphery of the transparent electrode 18 respectively, wherein a recess is formed in a middle of the p-electrode 21;

The metal material used for the n-electrode 20 and the p-electrode 21 is Cr/Al/Ti/Au, Cr/Pt/Au, Ni/Au, Ni/Ag/Pt/Au, Ti/Au or Ti/Pt/Au;

Step 8: forming the dielectric DBR layer 19 on the upper surface of the transparent electrode 18 in the recess of the p-electrode 21 to complete the manufacturing of the device. The dielectric DBR layer 19 is a multi-periodic $SiO_2/TiO_2$, $SiO_2/Ta_2O_5$, $TiO_2/Al_2O_3$ or $ZrO_2/SiO_2$ structure.

Figure 3:
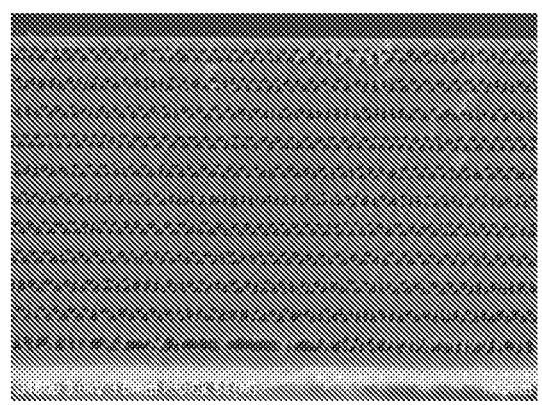
FIG. 3 is a picture of a scanning electron microscope of the bottom porous DBR of FIG. 1.
Figure 4:
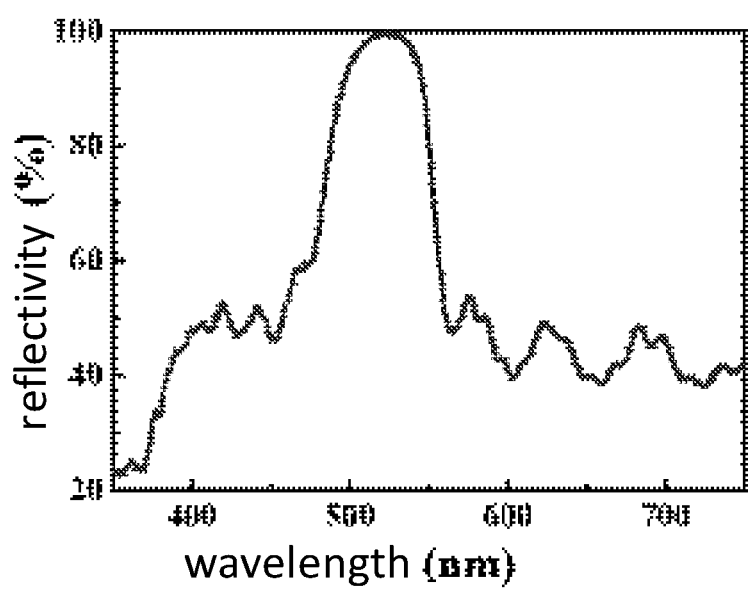
FIG. 4 is the reflection spectrum corresponding to FIG. 3.

Referring to FIG. 3, and in conjunction with FIG. 4, the present disclosure provides a picture of a scanning electron microscope of the GaN-based bottom porous DBR layer 12 and its corresponding reflection spectrum. The porous layers in FIG. 3 are the heavily doped GaN layers after electrochemical etching, and the uncorroded GaN layers are the lightly doped layers. The two layers of material have a refractive index difference due to the introduction of the air gaps and are alternately stacked to form the bottom porous DBR layer. In the reflection spectrum of FIG. 4, the abscissa is the wavelength and the ordinate is the reflectivity. As can be seen from the reflection spectrum, the bottom porous DBR layer 12 has a very high reflectivity and a wide high reflection band near 520 nm, which may meet the requirements of GaN-based green VCSELs for high reflectivity bottom mirrors.

With the lateral porous DBR of the embodiments of the present disclosure, the technical barrier of the high-reflectivity bottom mirror of the resonant cavity can be fundamentally broken. By electrochemical etching of the periodic GaN epitaxial structure in which non-doped layers (or lightly doped layers) and heavily doped layers are alternately stacked, lateral air channels can be selectively formed in the heavily doped layers, thus changing the effective refractive indexes of the layers, while the non-doped layers (or lightly doped layers) are not affected by the etching. The introduction of the air gaps will cause a certain refractive index difference between the porous GaN layers and the non-porous GaN layers, thereby forming a DBR composite structure in which the porous GaN layers and the non-porous GaN layers are alternately stacked. On this basis, the GaN-based VCSEL is manufactured using the dielectric DBR layer as the top mirror.

The specific embodiments described above further illustrate the purpose, technical solutions and beneficial effects of the present disclosure. It should be understood that the above description is only specific embodiments of the present disclosure and is not used to limit the present disclosure. Any modification, equivalent replacement, and improvement made within the spirit and principle of the present disclosure shall fall within the protection scope of the present disclosure.

We claim:

1. A method for manufacturing a GaN-based VCSEL chip based on porous DBR, comprising:
   step 1: growing a buffer layer, alternately stacked lightly doped layers and heavily doped layers, an n-type doped GaN layer, an active layer, an electron blocking layer, and a p-type doped GaN layer on a substrate sequentially, wherein the substrate is made of sapphire, Si or SiC;
   step 2: performing lateral etching on the alternately stacked lightly doped layers and heavily doped layers by using an electrochemical etching method, so as to transform them to a bottom porous DBR layer in which porous layers and non-porous layers are alternately stacked;
   step 3: etching down on a periphery of the p-type doped GaN layer by a depth so that a portion of the n-type doped GaN layer is etched, so as to form a mesa on the periphery of the n-type doped GaN layer;
   step 4: forming a current limiting layer on sidewalls of the p-type doped GaN layer, the mesa, the active layer, and the electron blocking layer;
   step 5: forming a current window on the current limiting layer, and removing a portion of the current limiting layer on the mesa, using a photolithography and etching technique;
   step 6: forming a transparent electrode at the current window on the p-type doped GaN layer;
   step 7: forming an n-electrode and a p-electrode on the mesa on which a portion of the current limiting layer is removed and a periphery of the transparent electrode respectively, wherein a recess is formed in a middle of the p-electrode; and
   step 8: forming a dielectric DBR layer on an upper surface of the transparent electrode in the recess of the p-electrode, so as to complete the manufacturing.

2. The method for manufacturing the GaN-based VCSEL chip based on porous DBR of claim 1, wherein the dielectric DBR layer and the bottom porous DBR layer constitute upper and lower mirrors of the VCSEL chip respectively, and the bottom porous DBR layer has a reflectivity of above 95% at a peak wavelength of the active layer, which is higher than the reflectivity of the dielectric DBR layer.

3. The method for manufacturing the GaN-based VCSEL chip based on porous DBR of claim 1, wherein the bottom porous DBR layer has a material of a multi-periodic DBR formed by stacking porous nitride layers and non-porous nitride layers alternately.

4. The method for manufacturing the GaN-based VCSEL chip based on porous DBR of claim 1, wherein the current limiting layer is made of $SiO_2$, SiNX, $HfO_2$ or $Al_2O_3$.

5. The method for manufacturing the GaN-based VCSEL chip based on porous DBR of claim 1, wherein an n-type GaN layer is further grown between the bottom porous DBR layer and the buffer layer, and is used as a current spreading layer applied for electrochemical etching to form the bottom porous DBR layer.

6. The method for manufacturing the GaN-based VCSEL chip based on porous DBR of claim 1, wherein the lightly doped layers have a doping concentration of $5 \times 10^{16}$ cm$^{-3}$ and the heavily doped layers have a doping concentration of $1 \times 10^{19}$ cm$^{-3}$.

* * * * *